(12) United States Patent
Graf et al.

(10) Patent No.: US 6,927,154 B2
(45) Date of Patent: Aug. 9, 2005

(54) METHOD FOR FABRICATING A TRANSISTOR WITH A GATE STRUCTURE

(75) Inventors: Werner Graf, Dresden (DE); Ulrike Bewersdorff-Sarlette, Radebeul (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/431,425

(22) Filed: May 6, 2003

(65) Prior Publication Data

US 2003/0215986 A1 Nov. 20, 2003

(30) Foreign Application Priority Data

May 6, 2002 (DE) ............................................ 102 20 189

(51) Int. Cl.[7] ................ H01L 21/3205; H01L 21/4763; H01L 21/31
(52) U.S. Cl. ........................ 438/592; 438/595; 438/588; 438/778
(58) Field of Search .......................... 257/412; 438/585, 438/587, 588, 592, 595, 778

(56) References Cited

U.S. PATENT DOCUMENTS

| | | |
|---|---|---|
| 5,736,455 A | 4/1998 | Iyer et al. |
| 5,739,066 A | 4/1998 | Pan |
| 5,998,290 A | 12/1999 | Wu et al. |
| 6,015,997 A | 1/2000 | Hu et al. |
| 6,194,294 B1 | 2/2001 | Lee |
| 6,198,144 B1 | 3/2001 | Pan et al. |
| 6,455,441 B1 * | 9/2002 | Beaman ...................... 438/778 |
| 6,465,335 B1 | 10/2002 | Kunikiyo |

OTHER PUBLICATIONS

"W/WNX/Poly–Si Gate Technology for Future High Speed Deep Submicron CMOS LSIs" by Kasai et al., IEDM 94, pp. 497–500.*
"Semiconductor Devices–Physics and Technology" by Sze, 1985, pp. 360–362.*
"Semiconductor Devices–Physics and Technology" by Sze, pp. 357–360.*

* cited by examiner

*Primary Examiner*—Steven Loke
(74) *Attorney, Agent, or Firm*—Laurence A. Greenberg; Werner H. Stemer; Ralph E. Locher

(57) ABSTRACT

A gate structure of a transistor is fabricated with an additional barrier formed on a metal layer of the gate structure before the deposition of a silicon oxide layer. Applying this barrier layer on the metal layer before the deposition of the silicon oxide layer prevents an oxidation of the metal during the deposition of the silicon oxide layer. A lowering of the conductivity of the metal layer or a loss of metal through sublimating metal oxide is thereby prevented. As a result, in particular the performance of the gate structure or of the transistor is improved further. In addition, disturbing coupling effects in the circuit are significantly reduced by the use of the silicon oxide cap.

13 Claims, 2 Drawing Sheets

METHOD FOR FABRICATING A TRANSISTOR WITH A GATE STRUCTURE

BACKGROUND OF THE INVENTION

Field of the Invention

The present invention relates to a gate structure of a transistor and to a method for fabricating transistor and the gate structure.

Transistors, in particular field-effect transistors (FETs), form an important component of present-day integrated circuits. For the patterning of the gate electrodes of field-effect transistors, the latter are often etched from a relatively thick electrically conductive layer. It is thereby customary for the gate electrode to be an integral constituent part of so-called gate tracks, for example, of a word line, which also has, in addition to the gate electrode, connecting lines that connect a plurality of field-effect transistors to one another.

In conventional integrated circuits, heavily doped polysilicon is used as electrode material for field-effect transistors. However, it has been shown that, with this material, narrow limits are imposed on reducing the electrode height and increasing the operating speed of the circuit. Reduction of the electrode height is desirable for process technological reasons since the planarity of the integrated circuit can be improved in this way, as a result of which, in turn, the quality of the lithographic processes used is improved. However, reducing the electrode height reduces the cross-sectional area, which in turn leads to an increase in the resistance of the electrode.

The operating speed of the circuit also depends, however, on the conductivity of the gate electrode or of the gate tracks. In order to increase the speed, it is desirable to use materials with low resistivity. Consequently, alternative materials allowing a further reduction of the resistivity of the layer from which the gate electrode is patterned have been sought.

By applying an additional layer of a metal silicide, with a low electrical resistance on the electrode layer, it has been possible to increase the electrical conductivity of the electrode. Suitable metal silicides having a high melting point are, for example, binary tungsten or titanium silicides, which have a melting point in the neighborhood of 1400° C. This high melting point enables these silicides to be used early in the patterning process of the integrated circuit, since the further patterning of the integrated circuit often requires the use of high temperatures during subsequent process steps.

Although these metal silicides have a significantly increased electrical conductivity compared with doped polysilicon, their resistivity is an order of magnitude higher than that of the pure metals. Therefore, intensive efforts have been made to use the pure metals as electrode materials. Tungsten is of particular interest in this case since it is comparatively inexpensive, has a high melting point (approximately 3410° C.) and can be integrated into existing process sequences with adaptation of the individual process steps to the properties of the metal.

Such a procedure is proposed, for example, in U.S. Pat. No. 6,198,144 B1, which describes a gate electrode of a field-effect transistor or the layer stack of a word line which comprises a polysilicon layer applied on a gate dielectric. An electrically conductive barrier layer is applied on the polysilicon layer. The barrier layer may be composed of tungsten nitride, for example. Lying above the barrier layer is a metal layer, which may be composed of tungsten, for example. On the metal layer, a silicon dioxide layer ("cap oxide") was deposited as an insulating cap, and a silicon nitride layer was deposited, in turn, on the silicon dioxide layer.

With the electrode stack described in the U.S. Pat. No. 6,198,144 B1 the problem arises that, under the conditions under which silicon oxide layers are usually deposited as cap oxides in semiconductor technology, the metal layer used in the gate electrode may already be oxidized and, consequently, the conductivity of the electrode may be impaired by the deposition of silicon oxide on the metal layer. Although this problem is largely avoided by using a different cap material, for example silicon nitride instead of silicon oxide, the gate electrode or the word line is shielded less well by the silicon nitride cap so that stronger coupling effects occur within the integrated circuit and may have a disadvantageous effect on the circuit properties.

SUMMARY OF THE INVENTION

It is accordingly an object of the invention to provide a gate structure for a transistor, in particular a field-effect transistor, which overcomes the above-mentioned disadvantages of the heretofore-known devices and methods of this general type and which combines a high electrical conductivity with reduced coupling effects. It is a further object to provide an advantageous method of fabricating the transistor with such a gate structure.

With the foregoing and other objects in view there is provided, in accordance with the invention, a method of fabricating a gate structure of a transistor. The novel method comprises:

depositing a sequence of layers for a gate electrode layer stack on a gate dielectric; and patterning a gate electrode layer stack on the gate dielectric from the sequence of layers and forming a stack having the following layers:

at least one doped polysilicon layer on the gate dielectric;

at least one first, electrically conductive barrier layer on the polysilicon layer;

at least one metal layer on the first, electrically conductive barrier layer;

at least one second barrier layer on the metal layer; and at least one insulating cap made of silicon oxide, applied on the second barrier layer.

In other words, the invention provides a method for fabricating a gate structure of a transistor, a gate electrode layer stack being patterned on a gate dielectric, and the layer stack comprising at least the above-mentioned layers.

Applying this barrier layer on the metal layer before the deposition of the silicon oxide layer prevents an oxidation of the metal during the deposition of the silicon oxide layer. A lowering of the conductivity of the metal layer or a loss of metal through sublimating metal oxide is thereby prevented. As a result, in particular the performance of the gate structure or of the transistor is improved further. In addition, disturbing coupling effects in the circuit are significantly reduced by the use of the silicon oxide cap.

In accordance with a particularly preferred embodiment of the present invention, in an additional step at least one sidewall passivation layer is applied on the sidewalls of the gate electrode layer stack at least in the region of the first, electrically conductive barrier layer and of the metal layer.

In accordance with an added feature of the invention, for the patterning of the layer stack, a doped polysilicon layer, at least one first, electrically conductive barrier layer, a metal layer, at least one second barrier layer and also a silicon dioxide layer are applied one after the other over the gate dielectric and the gate electrode layer stack is subsequently patterned from the layers deposited over the gate dielectric by means of an etching technique.

In this method variant, after the patterning of the gate-electrode layer stack in a subsequent optional method step, the sidewall passivation layer may be deposited directly up to the gate dielectric and patterned.

In a further particularly preferred method variant of the present invention for the patterning of the layer stack, a doped polysilicon layer, at least one first, electrically conductive barrier layer, a metal layer and at least one second barrier layer are applied one after the other over the gate dielectric, these layers are subsequently patterned by means of an etching technique and afterward, in order to complete the gate electrode layer stack, a silicon dioxide layer is deposited at least on the second barrier layer.

This method variant affords the advantage that a protective silicon oxide layer can be deposited together with the deposition of the silicon dioxide cap on the second barrier layer over the gate dielectric. This silicon oxide layer protects, for example, the gate dielectric or the underlying elements of the transistor, for example, the source and drain regions, during the patterning of the sidewall passivation layer in a subsequent optional method step. After the patterning of the sidewall passivation layer, the silicon oxide layer may be removed again in the region of the gate dielectric.

Conventional patterning steps, for example photolithographic patterning steps, may be used for the patterning of the gate electrode layer stack. To that end, on the silicon dioxide layer or the barrier layer, a lithography mask is applied, exposed, and developed, and an etching is subsequently carried out in order that the previously deposited layers are removed again, in the region not covered by the mask, from the substrate wherein the gate dielectric has been patterned, so that a corresponding layer stack remains, in the region covered by the mask. Afterward, the lithography mask is removed again for example by etching or by incineration.

In a preferred embodiment of the present invention, the second barrier layer is a metal nitride layer, preferably a tantalum nitride or silicon nitride layer.

Preferably, the second barrier layer is applied by chemical vapor deposition methods, preferably by LPCVD (low-pressure chemical vapor deposition), PECVD (plasma-enhanced chemical vapor deposition) or RTCVD (rapid thermal anneal chemical vapor deposition) methods, on the metal layer.

In a further preferred embodiment of the method according to the invention the metal layer is composed of a material chosen from the group comprising aluminum, copper, tungsten, titanium, platinum, palladium, cobalt, molybdenum, nickel, rhodium, iridium and electrically conductive metal alloys. It is particularly preferred for the metal layer to be composed of a material having a relatively high melting point. The use of these metals ensures that the gate structure has a sufficient thermal stability in subsequent patterning steps. The use of tungsten or titanium, in particular of tungsten, is particularly preferred. The various metal layers may be applied by means of conventional metal deposition methods.

The first, electrically conductive barrier layer should be impervious to silicon atoms and the atoms of the metal layer and thus serve as a diffusion barrier for the respective materials adjacent to the barrier layer. In a preferred variant of the method according to the invention, the first, electrically conductive barrier layer is a tungsten nitride layer ($WN_x$) or titanium nitride layer ($TiN_x$). If tungsten is used as a material for the metal layer, the use of tungsten nitride as electrically conductive barrier layer is particularly preferred. The barrier layer may also be constructed from a plurality of layers of different composition. By way of example, it is possible for the barrier layer to comprise a plurality of tungsten nitride layers each having a different nitrogen content.

In a further preferred embodiment of the invention, the sidewall passivation layer is a nitride layer, preferably a silicon nitride layer. These are deposited and patterned by means of conventional techniques on the sidewalls of the patterned gate electrode layer stack. It is particularly preferred, for the application of the sidewall passivation layer, for the latter to be deposited by means of a chemical vapor deposition method, preferably an LPCVD (low-pressure chemical vapor deposition) or RTCVD (rapid thermal anneal chemical vapor deposition) method. The patterning of the sidewall passivation layer may also comprise in addition to the deposition, further patterning steps, for example etching-back steps, depending on the form to be attained by the sidewall passivation layer. The sidewall passivation layer protects the layers which it covers from oxidation in subsequent process steps, for example a source/drain reoxidation.

In a further preferred variant of the method according to the invention, the gate structure is patterned as an integral constituent part of a gate track, in particular of a word line. In this case, the distinction between the different constituent parts of the gate track, that is to say the gate structure and the pure connecting lines, is defined by the position and extent of the gate dielectric on the wafer substrate.

The present method according to the invention is preferably a constituent part of a larger overall process for fabricating an integrated circuit. In particular, it may be a constituent part of a process for patterning a transistor, preferably a field-effect transistor, on a semiconductor substrate.

In the context of the present invention, the gate dielectric will generally be a gate oxide, but other materials may also be used as gate dielectric.

A further aspect of the present invention provides a gate structure of a transistor comprising a gate electrode layer stack containing

- at least one doped polysilicon layer applied on the gate dielectric,
- at least one first, electrically conductive barrier layer applied on the polysilicon layer,
- at least one metal layer applied on the first, electrically conductive barrier layer,
- at least one second barrier layer applied on the metal layer, and
- at least one insulating cap made of silicon oxide, which is applied on the second barrier layer.

In accordance with a concomitant feature of the invention, the gate structure comprises at least one sidewall passivation layer which extends at least in the region of the first, electrically conductive barrier layer and of the metal layer on the sidewalls of the gate electrode layer stack.

The gate structure according to the invention corresponds to the gate structure which can be obtained in accordance with the method according to the invention. Consequently, all the explanations made in that case with regard to the preferred embodiments also equally apply to the gate structure according to the invention.

Other features which are considered as characteristic for the invention are set forth in the appended claims.

Although the invention is illustrated and described herein as embodied in transistor gate structure and a corresponding fabrication method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
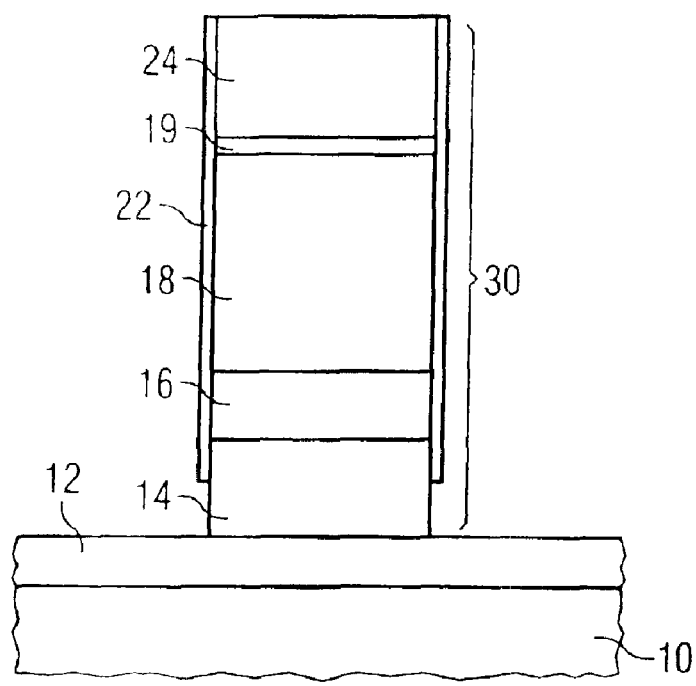
FIG. 1 is a partial elevational view of a preferred embodiment of the gate structure according to the invention.

Referring now to the figures of the drawing in detail and first, particularly, to FIG. 1 thereof, there is shown a diagrammatic illustration of a preferred embodiment of the gate structure according to the invention. A gate dielectric 12, in this case a gate oxide, is applied on a substrate 10 containing further elements of the transistor. The other transistor elements are not illustrated so as to preserve the clarity and simplicity of the inventive features throughout the drawing figures. In the embodiment shown, the gate electrode layer stack 30 is constructed from a polysilicon layer 14 applied on the gate oxide 12, an electrically conductive barrier layer 16 made of tungsten nitride applied above that, the metal layer 18 made of tungsten arranged above that, a second barrier layer 19 made of silicon nitride arranged above the metal layer, and the cap 24 made of silicon dioxide, which insulates the layer stack 30 toward the top.

Sidewall passivation layers 22 made of silicon nitride are applied on the sidewalls of the gate electrode layer stack 30 in order to protect the gate electrode layer stack 30 from oxidation in subsequent process steps. In the embodiment shown in FIG. 1, the sidewall passivation layers 22 cover all the layers of the gate electrode layer stack 30 except for partial regions of the polysilicon layer, which is not covered by the sidewall passivation layers 22 in its regions of the sidewalls which adjoin the gate oxide.

Figure 2A:
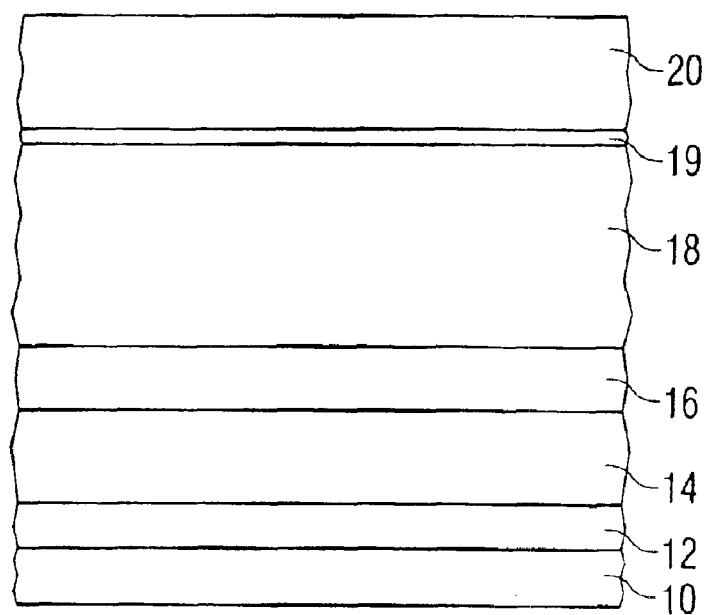
FIGS. 2A–2C are diagrammatic sectional views illustrating different steps of a preferred embodiment of the method according to the invention.
Figure 2B:
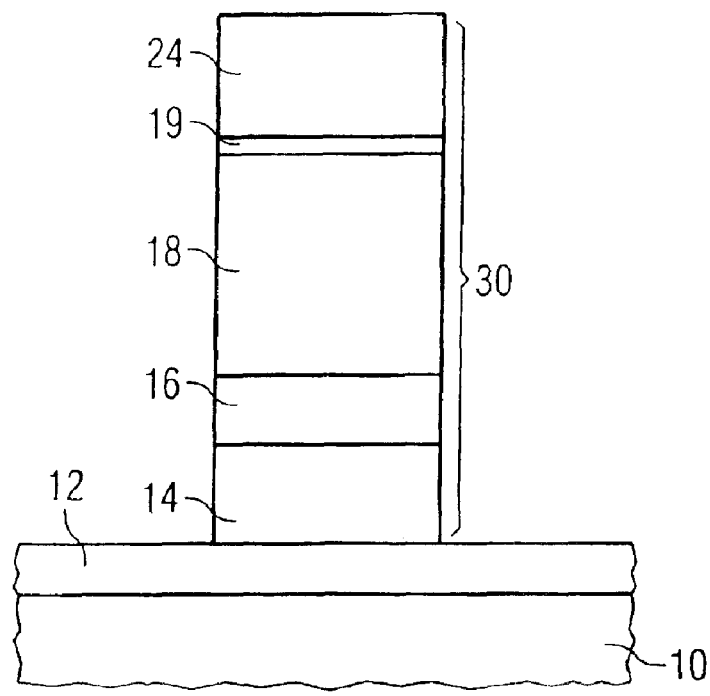
Figure 2C:
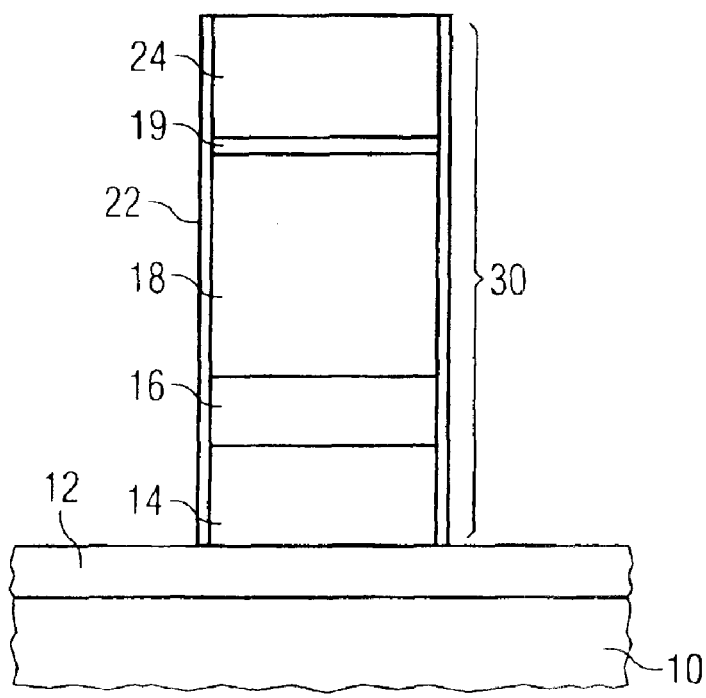

FIGS. 2A–2C show a few method steps of a preferred embodiment of the method according to the invention. FIG. 2A shows a layer sequence of different layers which were deposited one after the other on the substrate in order to construct the gate electrode layer stack 30. On the substrate 10, wherein further elements of the transistor were already patterned, a gate dielectric 12, in this case a gate oxide, was deposited and patterned. A doped polysilicon layer 14, a tungsten nitride layer 16, a tungsten layer 18, a silicon nitride layer 19 and a silicon dioxide layer were subsequently deposited over the gate oxide. In this case, the silicon nitride layer was deposited by way of an RTCVD method (rapid thermal chemical vapor deposition).

The layer sequence was subsequently patterned by means of a suitable etching technique, for example a photolithography method, to form the gate electrode layer stack 30 shown in FIG. 2B. Afterward, for sidewall passivation, the sidewall passivation layers were deposited on the sidewalls of the layer stack by means of an LPCVD method (low pressure chemical vapor deposition) and subsequently patterned by means of a suitable etching technique.

The sidewall passivation layers 22 as shown in FIG. 2C are illustrated in idealized form. In the embodiment of the method which is illustrated in FIG. 2C, the silicon nitride for the sidewall passivation is deposited directly up to the gate oxide. If such a structure is desired, the etching technique used for patterning the gate electrode layer stack 30 can be carried out after the deposition of all the layers forming the gate electrode layer stack 30. If this is to be avoided and the sidewall passivation layers 22 are to extend only over an upper partial region of the polysilicon layer (as shown in FIG. 1), this region can be protected from the deposition of the passivation layers 22 for example by a silicon dioxide layer which is removed again later.

In this respect, it is expedient to vary the above-described method to the effect that the gate electrode layer stack is patterned as early as after the deposition of the second barrier layer 19 by means of a corresponding etching technique, for example, a correspondingly adapted photolithography technique, and then to form both the silicon dioxide cap 24 and the protective silicon dioxide layer (not shown) by deposition of silicon dioxide on the barrier layer 19 and the regions of the gate dielectric 12 which adjoin the gate electrode layer stack. After the deposition and patterning of the sidewall passivation layers, the silicon dioxide layer can then be removed again in the region of the gate oxide.

Applying the second barrier layer on the metal layer before the deposition of the silicon oxide layer prevents an oxidation of the metal during the deposition of the silicon oxide layer. A lowering of the conductivity of the metal layer or a loss of metal through sublimating metal oxide is thereby prevented. As a result, in particular the performance of the gate structure or of the transistor is improved further. In addition, disturbing coupling effects in the circuit are significantly reduced by the use of the silicon oxide cap.

We claim:

1. A method of fabricating a gate structure of a transistor, the method which comprises:

depositing a sequence of layers for a gate electrode layer stack on a gate dielectric; and patterning a gate electrode layer stack on the gate dielectric from the sequence of layers and forming a stack having the following layers:

at least one doped polysilicon layer on the gate dielectric;

at least one first, electrically conductive barrier layer on the polysilicon layer;

at least one metal layer on the first, electrically conductive barrier layer;

at least one undulating nitride barrier layer on the metal layer; and at least one insulating cap made of silicon oxide, applied on the insulating nitride barrier layer.

2. The method according to claim 1, which comprises, in an additional step, applying at least one sidewall passivation layer on sidewalls of the gate electrode layer stack, at least in a region of the first, electrically conductive barrier layer and the metal layer.

3. The method according to claim 1, which comprises forming, in sequence, the doped polysilicon layer, the at least one first, electrically conductive barrier layer, the metal layer, the at least one insulating nitride barrier layer, and a silicon dioxide layer one after the other over the gate dielectric, and subsequently patterning the gate electrode layer stack from the sequence of layers deposited over the gate dielectric with an etching technique.

4. The method according to claim 1, which comprises forming, in sequence, the doped polysilicon layer, the at least one first, electrically conductive barrier layer, the metal layer, and the at least one insulating nitride barrier layer one after the other over the gate dielectric, subsequently patterning the layers with an etching technique, and subsequently completing the gate electrode layer stack, by depositing a silicon oxide layer on the insulating nitride barrier layer.

5. The method according to claim 1, which comprises forming the insulating nitride barrier layer on the metal layer by chemical vapor deposition.

6. The method according to claim 5, which comprises forming the insulating nitride barrier layer with a process selected from the group consisting of low pressure chemical vapor deposition, plasma-enhanced chemical vapor deposition, and rapid thermal chemical vapor deposition.

7. The method according to claim 1, which comprises forming sidewall passivation layers on the sidewall of the gate electrode layer stack, and wherein the sidewall passivation layers are nitride layers.

8. The method according to claim 7, wherein the sidewall passivation layers are silicon nitride layers.

9. The method according to claim 7, which comprises patterning the sidewall passivation layers on the sidewall of the gate electrode layer stack by depositing the sidewall passivation layers with a chemical vapor deposition method.

10. The method according to claim 9, wherein the chemical vapor deposition method is low pressure chemical vapor deposition or rapid thermal chemical vapor deposition.

11. The method according to claim 1, which comprises forming the metal layer of a material selected from the group consisting of aluminum, copper, tungsten, titanium, platinum, palladium, cobalt, molybdenum, nickel, rhodium, iridium and electrically conductive metal alloys.

12. The method according to claim 1, which comprises forming the first, electrically conductive barrier layer as a tungsten nitride layer or a titanium nitride layer.

13. The method according to claim 1, which comprises patterning the gate structure as an integral constituent part of a word line.

* * * * *